United States Patent
Bustreo et al.

(10) Patent No.: US 11,862,375 B2
(45) Date of Patent: Jan. 2, 2024

(54) SUPPORT FOR MOUNTING AN ACCESSORY EQUIPMENT ASSEMBLY TO A BASE OF A BUSHING, A CORRESPONDING ACCESSORY EQUIPMENT MODULE AND BUSHING

(71) Applicant: HITACHI ENERGY LTD, Zürich (CH)

(72) Inventors: Gianluca Bustreo, Mirano (IT); Paolo Pavanello, Granze (IT); Marco Cocchio, Padua (IT)

(73) Assignee: HITACHI ENERGY SWITZERLAND AG, Baden (CH)

( * ) Notice: Subject to any disclaimer, the term of this patent is extended or adjusted under 35 U.S.C. 154(b) by 0 days.

(21) Appl. No.: 18/021,353

(22) PCT Filed: Sep. 29, 2021

(86) PCT No.: PCT/EP2021/076833
§ 371 (c)(1),
(2) Date: Feb. 14, 2023

(87) PCT Pub. No.: WO2022/069567
PCT Pub. Date: Apr. 7, 2022

(65) Prior Publication Data
US 2023/0268113 A1 Aug. 24, 2023

(51) Int. Cl.
*H01F 27/06* (2006.01)
*H01F 38/28* (2006.01)
*H01B 17/26* (2006.01)

(52) U.S. Cl.
CPC ............ *H01F 27/06* (2013.01); *H01B 17/26* (2013.01); *H01F 38/28* (2013.01)

(58) Field of Classification Search
CPC .......... H01F 27/06; H01F 38/28; H01B 17/26
See application file for complete search history.

(56) References Cited

U.S. PATENT DOCUMENTS

| 2,431,189 A | 11/1947 | Moreton et al. |
| 2,994,845 A | 8/1961 | Albright et al. |

(Continued)

FOREIGN PATENT DOCUMENTS

| DE | 10005164 A1 | 8/2001 |
| GB | 741936 A | 12/1955 |

(Continued)

OTHER PUBLICATIONS

International Search Report and Written Opinion of the International Searching Authority, PCT/EP2021/076833, dated Dec. 23, 2021, 12 pages.

(Continued)

*Primary Examiner* — Sherman Ng
(74) *Attorney, Agent, or Firm* — Sage Patent Group

(57) ABSTRACT

A support for mounting an accessory equipment assembly with one or more accessory equipment units, such as current transformer units, to a base of a bushing includes a conductor surrounded by an insulator part such that each of the accessory equipment units is positioned in a defined way regarding the conductor, wherein said support includes aligning means for aligning each individual accessory equipment unit separately with respect to the conductor. A corresponding accessory equipment module includes an accessory equipment assembly with one or more accessory equipment units, such as current transformer units, and a support for mounting the accessory equipment assembly as well as a bushing unit including a bushing and said kind of accessory equipment module.

9 Claims, 2 Drawing Sheets

(56) References Cited

U.S. PATENT DOCUMENTS

| | | | | |
|---|---|---|---|---|
| 4,477,692 A * | 10/1984 | Brealey | ........... | H01B 17/26 |
| | | | | 174/31 R |
| 4,670,625 A * | 6/1987 | Wood | ........... | H01F 27/04 |
| | | | | 174/152 R |
| 5,337,034 A * | 8/1994 | Grimes | ........... | H01F 27/06 |
| | | | | 248/500 |
| 6,008,711 A * | 12/1999 | Bolam | ........... | H01F 27/06 |
| | | | | 336/65 |
| 6,255,589 B1 * | 7/2001 | Starck | ........... | H01B 17/265 |
| | | | | 174/74 A |
| 6,346,677 B1 * | 2/2002 | Guillemette | ........... | H01B 17/26 |
| | | | | 174/152 R |
| 2013/0088314 A1 * | 4/2013 | Francoeur | ........... | H05B 6/105 |
| | | | | 29/33 F |
| 2013/0155640 A1 * | 6/2013 | Sano | ........... | H05K 7/02 |
| | | | | 361/816 |
| 2014/0209569 A1 * | 7/2014 | Miyatake | ........... | H01H 33/662 |
| | | | | 218/134 |
| 2016/0217898 A1 * | 7/2016 | Kozuru | ........... | H02B 11/04 |

FOREIGN PATENT DOCUMENTS

| | | | |
|---|---|---|---|
| JP | 2009081184 A | 4/2009 | |
| KR | 20180120140 A | 11/2018 | |
| WO | 2016027494 A1 | 2/2016 | |

OTHER PUBLICATIONS

Decision for Grant of Patent, Korean Patent Application No. 10-2023-7010862, dated Oct. 25, 2023, 6 pages.

\* cited by examiner

SUPPORT FOR MOUNTING AN ACCESSORY EQUIPMENT ASSEMBLY TO A BASE OF A BUSHING, A CORRESPONDING ACCESSORY EQUIPMENT MODULE AND BUSHING

CROSS-REFERENCE TO RELATED APPLICATIONS

This application is a 35 U.S.C. § 371 national stage application of PCT International Application number PCT/EP2021/076833 filed on Sep. 29, 2021, which in turn claims priority to European Application No. 20199311.0, filed on Sep. 30, 2020, the disclosures and content of which are incorporated by reference herein in their entireties.

TECHNICAL FIELD

The disclosure relates to a support for mounting an accessory equipment assembly with one or more accessory equipment units, such as current transformer units, to a base of a bushing comprising a conductor surrounded by an insulator part such that each of the accessory equipment units is positioned in a defined way regarding the conductor.

The disclosure further relates to a corresponding accessory equipment module comprising an accessory equipment assembly with one or more accessory equipment units, such as current transformer units, and a support for mounting the accessory equipment assembly as well as a bushing unit comprising a bushing and such kind of accessory equipment module, wherein the bushing comprises a conductor, an insulator part surrounding the conductor and a base for the accessory equipment module.

BACKGROUND

Such a bushing unit with a bushing and an accessory equipment module is used in various high voltage applications. The bushing comprises a rod-shaped conductor surrounded by an insulator part and a base at one end portion of the bushing, wherein this end portion serves to attach the bushing to a device, such as a transformer tank of a transformer, supporting this bushing unit. An accessory equipment assembly with one or more accessory equipment units like current transformer units (CT: current transformer) is then often attached to the end portion and/or the base of said bushing. In many applications the bushing is designed as a bushing with a feed-through, e.g. a transformer bushing.

Currently the current transformer units or other accessory equipment units are often applied to the insulator parts (insulator turrets) by means of laminated wood or pressboard supports which may be made and designed according to the different applications. The different dimensions and number of accessory equipment units each time may be accompanied by the design and construction of supports dedicated to the type of bushing and application utilized.

This type of supports do not allow easy alignment of the accessory equipment units with the body of the bushing immersed in oil, and consequently the installation and handling of the bushing and CT module is very difficult, in particular when it is necessary to provide more than one CT unit for each isolator/isolator bushing. The same installation and alignment problems are found in the event of maintenance or replacement of the bushing.

When the use of a bellow couplings is utilized to allow the bushing to be able to move, the supports and the CT units are fixed and therefore united with the turrets or the transformer tank. Due to this, the supports can go to touch the walls of the bellow coupling's bellows since they are integral with the base of the bushing, damaging or worse causing damage to the transformer itself.

A further challenge is that many CT units are mounted vertically with considerable difficulty given the size of the isolator bushings themselves.

SUMMARY

It is therefore an object of the disclosure to provide measures to overcome the above mention problems.

The object of the disclosure is solved by the features of the independent claims. Additional embodiments are detailed in the dependent claims.

Thus, the object is solved by a support for mounting an accessory equipment assembly with one or more accessory equipment units to a base of a bushing comprising a conductor surrounded by an insulator part such that each of the accessory equipment units is positioned in a defined way regarding the conductor, wherein said support comprises aligning means for aligning each individual accessory equipment unit separately with respect to the conductor. Such a support can be used to create a uniform mounting connection of the accessory equipment unit(s) to the base, with the possibility of subsequent alignment of the units (a readjustment of the units) even after mounting the accessory equipment units on the base.

In particular, the object is solved by a support for mounting an accessory equipment assembly with one or more accessory equipment units, such as current transformer units, to a base of a bushing comprising a conductor surrounded by an insulator part such that each of the accessory equipment units is positioned in a defined way regarding the conductor, wherein said support comprises aligning means for aligning each individual accessory equipment unit separately with respect to the conductor, and the aligning means are configured such that the accessory equipment units are independently from each other adjustable with respect to the conductor, in a state when the accessory equipment assembly is mounted to the base.

A typical example of such accessory equipment units are current transformer units. With regard to the conductor these current transformer units are usually positioned in such a way that each of the current transformer units circumferentially surrounds the conductor. The abbreviation CT stands for Current Transformer, for example "CT unit" for "current transformer unit". Other kinds of accessory equipment units are other measuring units, switching units, control units, etc.

This type of modular support allows easy interfacing and fixing to the base of the bushing and an equally easy adjustment of the position of the accessory equipment unit(s), using dedicated adjustment means in the three directions: vertical, horizontal and oblique. This adjustment can also be made subsequently, i.e. after installation/fastening to the base.

This feature, of an easy adjustment of the accessory equipment units(s), also allows the independent adjustment of each accessory equipment unit, greatly facilitating the installation of these, when an installation of more than one accessory equipment unit on the same isolator is utilized.

In addition, since the support is integrated with the bushing is reduced, also the handling of the whole bushing and accessory equipment modules assembly or disassembly is considerably facilitated, also for maintenance or replacement of one or more accessory equipment units or the isolator itself.

Now this adjustment can be done by placing the bushing in a horizontal position: fixed the main support to the base of the bushing and fixed by the accessory equipment units on the modular support, these will be easily adjustable.

Since the accessory equipment units are fixed inside the main support, there is no problem of accidental fall or displacement even when operating with the isolator horizontally, and therefore facilitating and securing the operator assigned to the installation or maintenance of this part of the transformer.

In case of request of bellows couplings, this solution solve also the problem of the incidental contact between the accessory equipment units and the bellows couplings itself and adjacent parts of transformer tank (turrets, . . . )

In case it is necessary to apply a bellows couplings, the modular support allows the fixing of the accessory equipment units to the base of the isolator: in this way the movement of the isolator brings with it integral way both the support with the accessory equipment units and the bellows, preventing the contact between accessory equipment units and bellows or other base components.

According to an embodiment of the disclosure a first group of these aligning means allows a movement of each accessory equipment unit substantially parallel to the conductor and an individual tilt of each accessory equipment unit within the accessory equipment assembly and a second group of these aligning means allows a movement of the accessory equipment assembly as a hole in two orthogonal directions in a plane perpendicular to the conductor. These aligning means can be used to carry out all the readjustments that are essential in this context.

According to another embodiment of the disclosure, both groups of aligning means allow the movement via adjustment slots and counter elements guided in these adjustment slots. Alignment slots have proven to be very good guide elements for alignment in this context. The counter elements are threaded rods or similar rod elements. Fixing elements matching the counter elements such as nuts to the threaded rods are additionally provided. Using these fixing elements, the desired alignment can be fixed.

The support for mounting an accessory equipment assembly may further comprise a frame having external fastening structures, which frame holds the accessory equipment arrangement in its interior. The frame has a sleeve-like contour, for example.

According to yet another embodiment of the disclosure the aligning means comprise a set of U-shaped elements including the adjustment slots.

The U-shaped elements may be located between the frame and the accessory equipment units.

According to another embodiment of the disclosure the counter elements corresponding to the first group of aligning means are mounted on the unit side and the counter elements corresponding to the second group of aligning means are mounted on the frame side.

The object of the disclosure is further solved by an accessory equipment module comprising an accessory equipment assembly with one or more accessory equipment units and the aforementioned support for mounting the accessory equipment assembly.

The object of the disclosure is further solved by a bushing comprising a conductor surrounded by an insulator part and a base with an aforementioned accessory equipment module.

According to an embodiment of the bushing the base comprises a bellow coupling. Such a bellow coupling may be utilized to allow the bushing to be able to move with respect to the device to which it is attached/fixed.

According to another embodiment of the bushing said bushing is configured as a bushing for a transformer. This may be a particularly useful application for this kind of bushing. In this case the bushing may be a bushing with a feed-through.

BRIEF DESCRIPTION OF DRAWINGS

These and other aspects of the disclosure will be apparent from and elucidated with reference to the embodiments described hereinafter.

In the drawings.

DESCRIPTION OF EMBODIMENTS

Figure 1:
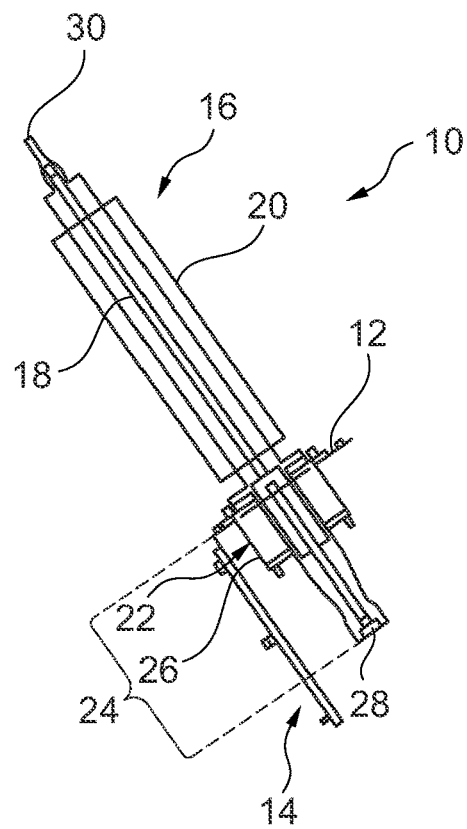
FIG. 1 shows a bushing unit with a bushing and a current transformer module mounted to a support structure of a high voltage application device.

FIG. 1 shows a bushing unit 10 mounted to a support structure 12 of a device 14 of a high voltage application. The bushing unit 10 comprises a bushing 16 with a rod-shaped conductor 18 surrounded by an insulator part 20 and a base 22 at one end portion 24 of the bushing 10, which is the base of an accessory equipment module 26 of the bushing unit 10. The device 14 might be a transformer tank of a transformer, supporting the bushing unit 10 by use of its support structure 12.

In many cases the bushing unit 10 is installed vertically. In the present case shown in FIG. 1, the isolator unit 10 is mounted on the support structure 12 in vertical installation situation as well. The illustration here is only a little diagonal. The isolator unit 10 has a lower device side with an electrical contact 28 (at the end of said end area) e.g. inside the tank and a higher air side with another electrical contact 30 at the opposite side. The rod-shaped conductor 18 electrically connects these two contacts 28, 30.

The exact design of the accessory equipment module 26 including the description of the individual components of this module 26 is discussed in connection with FIG. 2, which shows the accessory equipment module 26 in detail. The accessory equipment module 26 comprises an accessory equipment assembly 32 with a plurality of accessory equipment units 34, 36 and a support 38 for mounting the accessory equipment assembly 26 at the base 22 of the bushing 16. All accessory equipment units 34, 36 shown in the examples are current transformer units 34, 36. In the following, these current transformer units 34, 36 should be representative of all possible accessory equipment units 34, 36 that are positioned aligned in the area of bushings 16, such as sensors, relays, etc.

The support 38 comprises a frame 40 with external fastening structures 42, which frame 40 holds the accessory equipment assembly 32 in its interior. The frame 40 consists of two ring structures 44, 46 connected by cross members 48. The external fastening structures 42 are formed in the ring-structures 44, 46.

The support 38 comprises two groups of aligning means 50, 52 for aligning each individual current transformer unit 34, 36 separately with respect to the conductor 18, namely a first group of aligning means 50, which allows a movement of each current transformer unit 34, 36 substantially parallel to a conductor axis 54 of the conductor 18 and an individual tilt of each current transformer unit 34, 36 within the accessory equipment assembly 26 and a second group of these aligning means 52, which allows a movement of the accessory equipment assembly 32 as a hole in two orthogonal directions in a plane perpendicular to the conductor 18 (arrow group 56). Both groups of aligning means 50, 52 allow the movement via adjustment slots 58 and counter elements 60 guided in these adjustment slots 58. The counter elements 60 are threaded rods or similar rod elements. Fixing elements such as nuts matching the threaded rods are not shown.

The aligning means 50, 52 comprise a set of U-shaped elements 62 including the adjustment slots 58. The U-shaped elements 62 are located between the ring structures 44, 46 of the frame 40 and the current transformer units 34, 36 or the accessory equipment assembly 32 respectively. The counter elements 60 corresponding to the first group of aligning means 50 are mounted on the side of the current transformer units 34, 36 (which is at the base of the U-shaped elements 62) and the counter elements 60 corresponding to the second group of aligning means 52 are mounted on the side of the frame 40 (which is at the arms of the U-shaped elements 62). The counter elements 60 of the first group of aligning means 50 are arranged at angle elements 64, which carry the current transformer units 34, 36.

This type of modular support 38 allows easy interfacing and fixing of the CT units 34, 36 to the base 22 of the bushing 16 and an equally easy adjustment of the position of the CT units 34, 36, using the dedicated adjustment slots 58 in the three directions: vertical, horizontal and oblique (CT: Current Transformer).

This feature, of an easy adjustment of the CT units 34, 36, also allows the independent adjustment of each CT unit 34, 36, greatly facilitating the installation of these, when an installation of more than one CT units 34, 36 on the same bushing 16 is utilized.

In addition, since the support 38 is integrated with the bushing 16 is reduced, also the handling of the whole bushing 16 and CT module 26 assembly or disassembly is considerably facilitated, also for maintenance or replacement of one or more CT units 34, 36 or the isolator itself.

Now this adjustment can be done by placing the bushing 16 in a horizontal position: fixed the main support 38 to the base 22 of the bushing 16 and fixed by the CT units 34, 36 on the modular support 38, these will be easily adjustable through the adjustable slots 58 and counter elements 50 (pins/rods).

Since the CT units 34, 36 are fixed inside the main support 38, there is no problem of accidental fall or displacement even when operating with the isolator unit 10 horizontally, and therefore facilitating and securing the operator assigned to the installation or maintenance of this part of the transformer.

Figure 3:
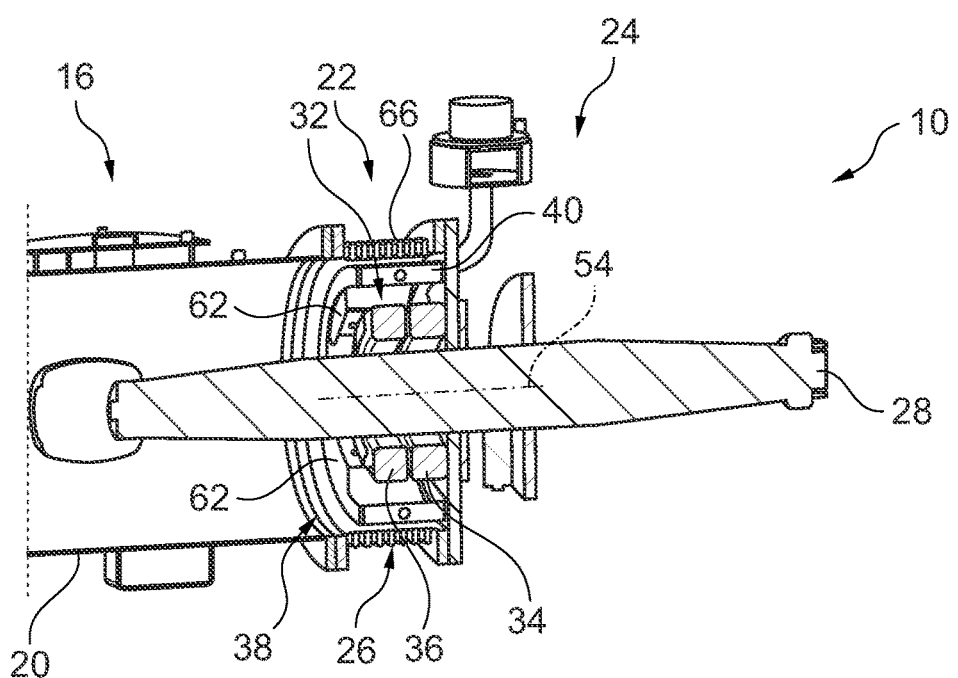
FIG. 3 shows details about the bushing unit in the region of the current transformer module.
Figure 2:
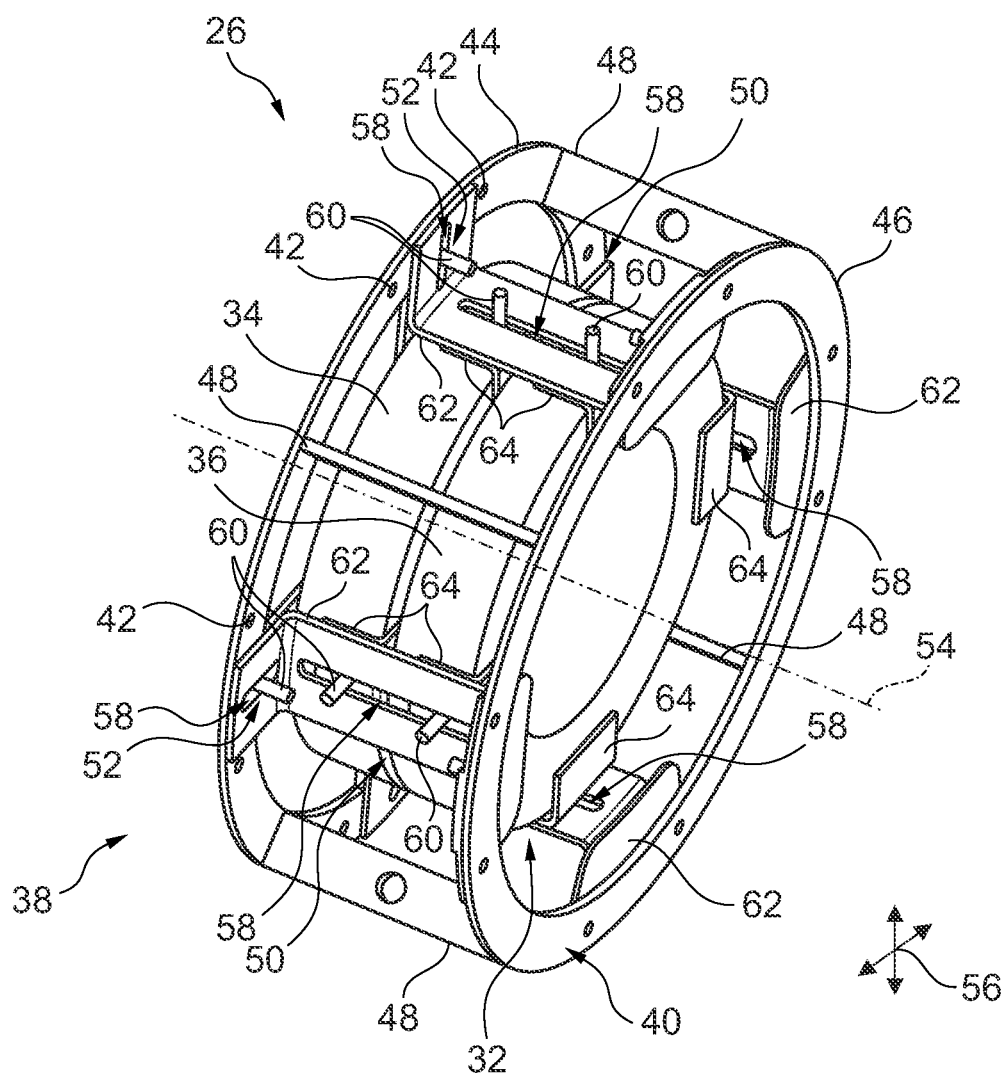
FIG. 2 shows a support for mounting the current transformer assembly to a base of a bushing.

Finally, FIG. 3 shows the accessory equipment module 26 of FIG. 2 mounted on the bushing 16 in a sectional view. The base of the bushing 16 comprises a bellow coupling 66. Such bellows couplings 66 are used to ensure the encapsulation of a displaceable bushing 16 with the corresponding movement. In FIG. 3 for example, the frame 40 of the support 38, the U-shaped elements 62 and the CT units 34, 36 of the accessory equipment assembly 32 are clearly visible. In this context, the alignment functions of the support 38 with respect to the CT units 34, 36 relative to the conductor 18 are also clearly visible.

In case of request of bellows couplings 66, this solution solve also the problem of the incidental contact between the CT units 34, 36 and the bellows coupling 66 itself and adjacent parts of transformer tank (turrets, . . . )

In case it is necessary to apply such a bellows coupling 66, the modular support 38 allows the fixing of the CT unit(s) 34, 36 to the base 22 of the bushing 16: in this way the movement of the bushing 16 brings with it integral way both the support 38 with the CT units 34, 36 and the bellows, preventing the contact between CT units 34, 36 and bellows of the bellow coupling 66.

While the disclosure has been illustrated and described in detail in the drawings and foregoing description, such illustration and description are to be considered illustrative or exemplary and not restrictive; the disclosure is not limited to the disclosed embodiments. Other variations to be disclosed embodiments can be understood and effected by those skilled in the art in practicing the claimed subject matter, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

REFERENCE SIGNS LIST 10 bushing unit
12 support structure
14 device
16 bushing
18 conductor
20 insulator part
22 base
24 end portion
26 accessory equipment module
28 contact, device-side
30 contact, air-side
32 accessory equipment assembly
34 current transformer unit, first
36 current transformer unit, second
38 support
40 frame
42 fastening structure
44 ring-structure
46 ring-structure
48 cross member
50 aligning means (first group)
52 aligning means (second group)
54 conductor axis
56 arrow group
58 adjustment slot
60 counter element
62 U-shaped element
64 angle element
66 bellow coupling

The invention claimed is:

1. A support for mounting an accessory equipment assembly with one or more accessory equipment units to a base of a bushing comprising a conductor surrounded by an insulator part such that each of the accessory equipment units is positioned in a defined way regarding the conductor, wherein said support comprises a first group of aligning means allowing a movement of each accessory equipment unit substantially parallel to the conductor and an individual tilt of each accessory equipment unit within the accessory equipment assembly and comprises a second group of aligning means allowing a movement of the accessory equipment assembly as a hole in two orthogonal directions in a plane perpendicular to the conductor, and both groups of aligning means allow the movement via adjustment slots and counter elements guided in these adjustment slots.

2. The support according to claim 1, further comprising a frame having external fastening structures, which frame holds the accessory equipment assembly in its interior.

3. The support according to claim 1, wherein the aligning means comprise a set of U-shaped elements including the adjustment slots.

4. The support according to claim 1, wherein the U-shaped elements are located between the frame and the accessory equipment units.

5. The support according to claim 1, wherein the counter elements corresponding to the first group of aligning means are mounted on the unit side and the counter elements corresponding to the second group of aligning means are mounted on the frame side.

6. An accessory equipment module comprising an accessory equipment assembly with one or more accessory equipment units, especially current transformer units, and a support for mounting the accessory equipment assembly according to claim 1.

7. A bushing unit comprising a bushing and the accessory equipment module according to claim 6, wherein the bushing comprises a conductor, an insulator part surrounding the conductor and a base for the accessory equipment module.

8. The bushing unit according to claim 7, wherein the base comprises a bellow coupling.

9. The bushing unit according to claim 7, wherein the bushing is configured as a bushing for a transformer.

* * * * *